United States Patent
Jensen et al.

(10) Patent No.: US 7,778,352 B2
(45) Date of Patent: Aug. 17, 2010

(54) DIGITAL COMPENSATION FOR NONLINEARITIES IN A POLAR TRANSMITTER

(75) Inventors: Henrik T. Jensen, Long Beach, CA (US); Hooman Darabi, Irvine, CA (US); Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 890 days.

(21) Appl. No.: 11/643,266

(22) Filed: Dec. 21, 2006

(65) Prior Publication Data

US 2008/0151974 A1    Jun. 26, 2008

(51) Int. Cl.
    *H04L 25/03* (2006.01)
(52) U.S. Cl. .................. 375/297; 375/146; 375/285; 455/114.2; 455/115.1
(58) Field of Classification Search .......... 375/146, 375/285, 295, 296, 297; 455/91, 114.2, 114.3, 455/115.1–115.4
    See application file for complete search history.

(56) References Cited

U.S. PATENT DOCUMENTS

| | | | |
|---|---|---|---|
| 6,266,517 B1* | 7/2001 | Fitzpatrick et al. | 455/114.3 |
| 6,275,685 B1* | 8/2001 | Wessel et al. | 455/126 |
| 7,133,649 B2* | 11/2006 | Kanazawa et al. | 455/91 |
| 7,248,643 B2* | 7/2007 | Takabayashi et al. | 375/296 |
| 7,346,122 B1* | 3/2008 | Cao | 375/296 |
| 7,418,056 B2* | 8/2008 | Suzuki et al. | 375/296 |
| 2006/0046665 A1* | 3/2006 | Yang et al. | 455/114.3 |
| 2008/0146168 A1* | 6/2008 | Jesson et al. | 455/90.2 |

* cited by examiner

*Primary Examiner*—Dac V Ha
(74) *Attorney, Agent, or Firm*—Garlick Harrison & Markison; Holly L. Rudnick

(57) ABSTRACT

A polar transmitter includes a digital processor coupled to receive a complex modulated digital signal and a feedback signal produced from the complex modulated digital signal and that is operable to compare the complex modulated digital signal to the feedback signal to determine an error signal indicative of a difference between the complex modulated digital signal and the feedback signal. The digital processor is further operable to produce a correction signal from the error signal and to add the correction signal to the complex modulated digital signal to produce a corrected complex modulated digital signal.

24 Claims, 12 Drawing Sheets

DIGITAL COMPENSATION FOR NONLINEARITIES IN A POLAR TRANSMITTER

BACKGROUND

1. Technical Field

The present invention relates to wireless communications and, more particularly, wideband wireless communication systems.

2. Related Art

Modern wireless RF transmitters for applications, such as cellular, personal, and satellite communications, employ digital modulation schemes such as frequency shift keying (FSK) and phase shift keying (PSK), and variants thereof, often in combination with code division multiple access (CDMA) communication. Independent of the particular communications scheme employed, the RF transmitter output signal, $s_{RF}(t)$, can be represented mathematically as $$s_{RF}(t) = r(t)\cos(2\pi f_c t + \theta(t)) \quad (1)$$

where $f_c$ denotes the RF carrier frequency, and the signal components $r(t)$ and $\theta(t)$ are referred to as the envelope and phase of $s_{RF}(t)$, respectively.

Some of the above mentioned communication schemes have constant envelope, i.e., $$r(t) = R,$$

and these are thus referred to as constant-envelope communications schemes. In these communications schemes, $\theta(t)$ constitutes all of the information bearing part of the transmitted signal. Other communications schemes have envelopes (amplitudes) that vary with time and these are thus referred to as variable-envelope communications schemes. In these communications schemes, both $r(t)$ and $\theta(t)$ constitute information bearing parts of the transmitted signal.

The most widespread standard in cellular wireless communications is currently the Global System for Mobile Communications (GSM). The GSM standard employs Gaussian Minimum Shift Keying (GMSK), which is a constant-envelope binary modulation scheme allowing raw transmission at a maximum rate of 270.83 kilobits per second (kbps). Even higher data rates are achieved in the specification of the Enhanced Data rates for GSM Evolution (EDGE) cellular telephony standard by selectively applying a $3\pi/8$ offset, 8-level PSK (8-PSK) modulation scheme. With this variable-envelope communication scheme, the maximum bit rate is tripled compared to GSM, while the chosen pulse shaping ensures that the RF carrier bandwidth is the same as that of GSM, allowing for the reuse of the GSM signal bandwidths.

As mentioned above, the 8-PSK modulation scheme of EDGE is an example of a variable envelope communications scheme. A common transmitter used in such variable-envelope modulation communications schemes is the polar transmitter. In a typical polar transmitter architecture, digital baseband data enters a digital processor that performs the necessary pulse shaping and modulation to some intermediate frequency (IF) carrier $f_{IF}$ to generate digital amplitude-modulated and digital phase-modulated signals. The digital amplitude-modulated signal is input to a digital-to-analog converter (DAC), followed by a low pass filter (LPF), along an amplitude path, and the digital phase-modulated signal is input to another DAC, followed by another LPF, along a phase path. The output of the LPF on the amplitude path is an analog amplitude signal, while the output of the LPF on the phase path is an analog phase signal. The analog phase signal is input to a phase-locked loop (PLL) to enable the phase of the RF output signal to track the phase of the analog phase signal. The RF output signal is modulated in a non-linear power amplifier (PA) by the analog amplitude signal. Thus, in polar transmitter architectures, the phase component of the RF signal is amplified through the non-linear PA while the amplitude modulation is performed at the output of the PA.

In practice, the power spectrum emitted from an EDGE polar transmitter will not be ideal due to various imperfections in the RF transmitter circuitry. Thus, quality measures of the transmitter performance have been established as part of the EDGE standard and minimum requirements have been set. One quality measure that relates to the RF signal power spectrum is the so-called spectral mask. This mask represents the maximum allowable levels of the power spectrum as a function of frequency offset from the RF carrier in order for a given transmitter to qualify for EDGE certification. In other words, the spectral mask requirements limit the amount of transmitter signal leakage into other users' signal spectrum. For example, at a frequency offset of 400 kHz (0.4 MHz), the maximum allowable emission level is −54 dB relative to the carrier (dBc). Another RF transmitter quality measure of the EDGE standard is the modulation accuracy, which relates the RF transmitter modulation performance to an ideal reference signal. Modulation accuracy is related to the so-called error vector magnitude (EVM), which is the magnitude of the difference between the actual transmitter output and the ideal reference signal. The error vector is, in general, a complex quantity and hence can be viewed as a vector in the complex plane. Modulation accuracy is stated in root-mean-square (RMS), 95th percentile, and peak values of the EVM and is specified as a percentage. For a given transmitter to qualify for EDGE certification, the RMS EVM must be less than 9%, the 95th percentile of EVM values must be less than 15%, and the peak EVM value must be less than 30%.

One component of the RF circuitry that significantly affects the performance of the transmitter is the power amplifier. There are three main sources of nonlinearities in most power amplifiers that contribute to the degradation of both the spectral mask and the EVM. The first source is known as LO feed-through (LOFT). Within a polar transmitter, the RF phase-modulated signal is typically generated by up-converting the IF phase-modulated signal to the desired RF signal using a local oscillator generator (LO). As such, the RF phase-modulated signal is commonly referred to as the LO signal. Ideally, the output of the power amplifier includes only the product of the LO signal and the amplitude-modulated signal. However, due to imperfections in the power amplifier, a portion of the LO signal may also appear at the power amplifier output. This leakage of the LO signal affects the performance of the transmitter by increasing both the spectral mask and the EVM.

The other sources of nonlinearities in the power amplifier are AM-AM distortion and AM-PM distortion. As the amplitude of the output signal varies, distortion is added to both the amplitude-modulated (AM) signal and the phase-modulated (PM) signal. For example, since the amount of LO leakage changes with the amplitude level of the output signal, when amplitude modulation is applied to the power amplifier, there is a variation in the carrier's phase due to the leakage that is a function of the carrier's envelope (amplitude). This effect is known as AM-PM distortion, and is critical when the power amplifier operates at high output power level.

Therefore, what is needed is a polar transmitter architecture capable of compensating for nonlinearities in the power amplifier.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
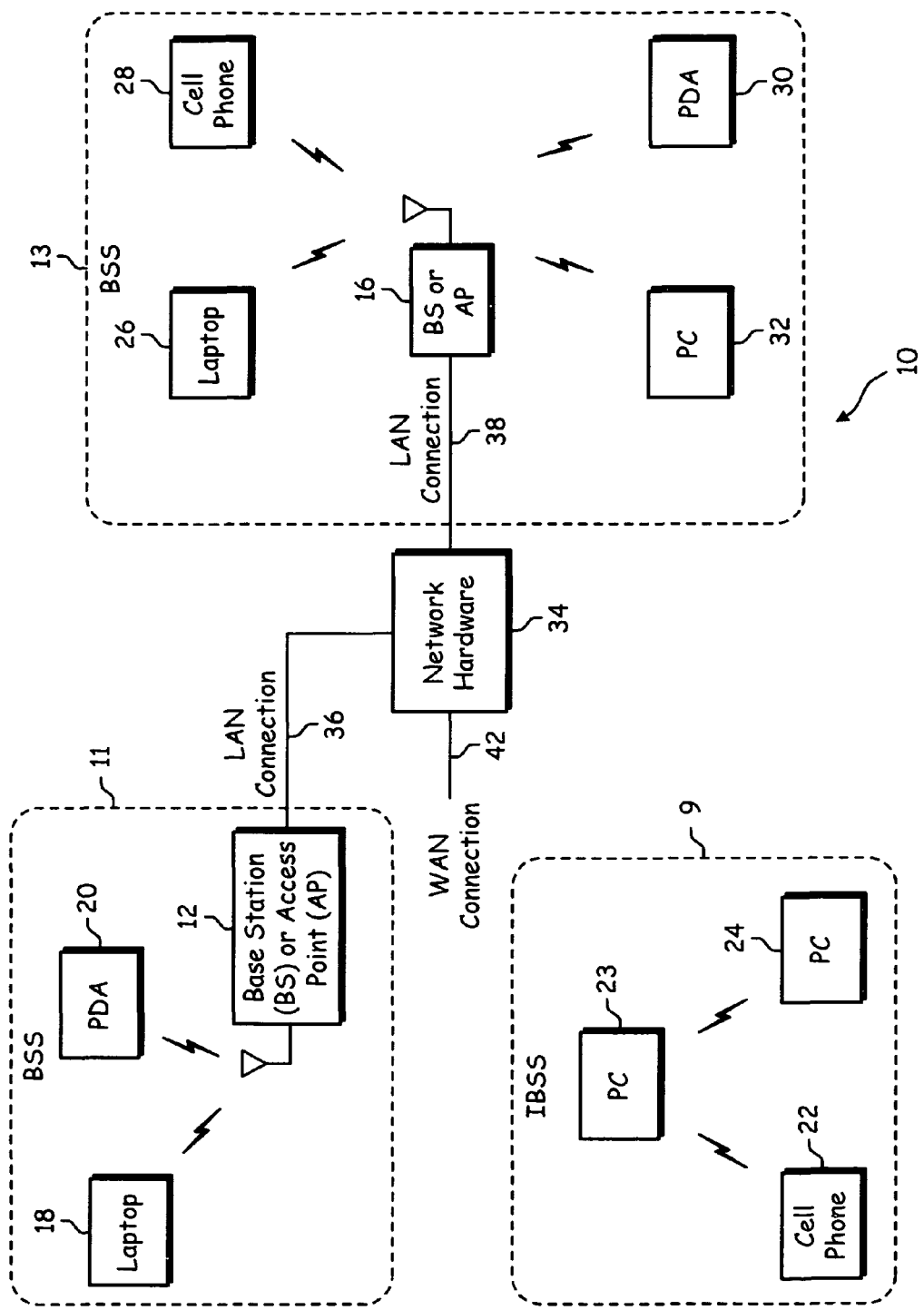
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail below with reference to FIGS. 2-5.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
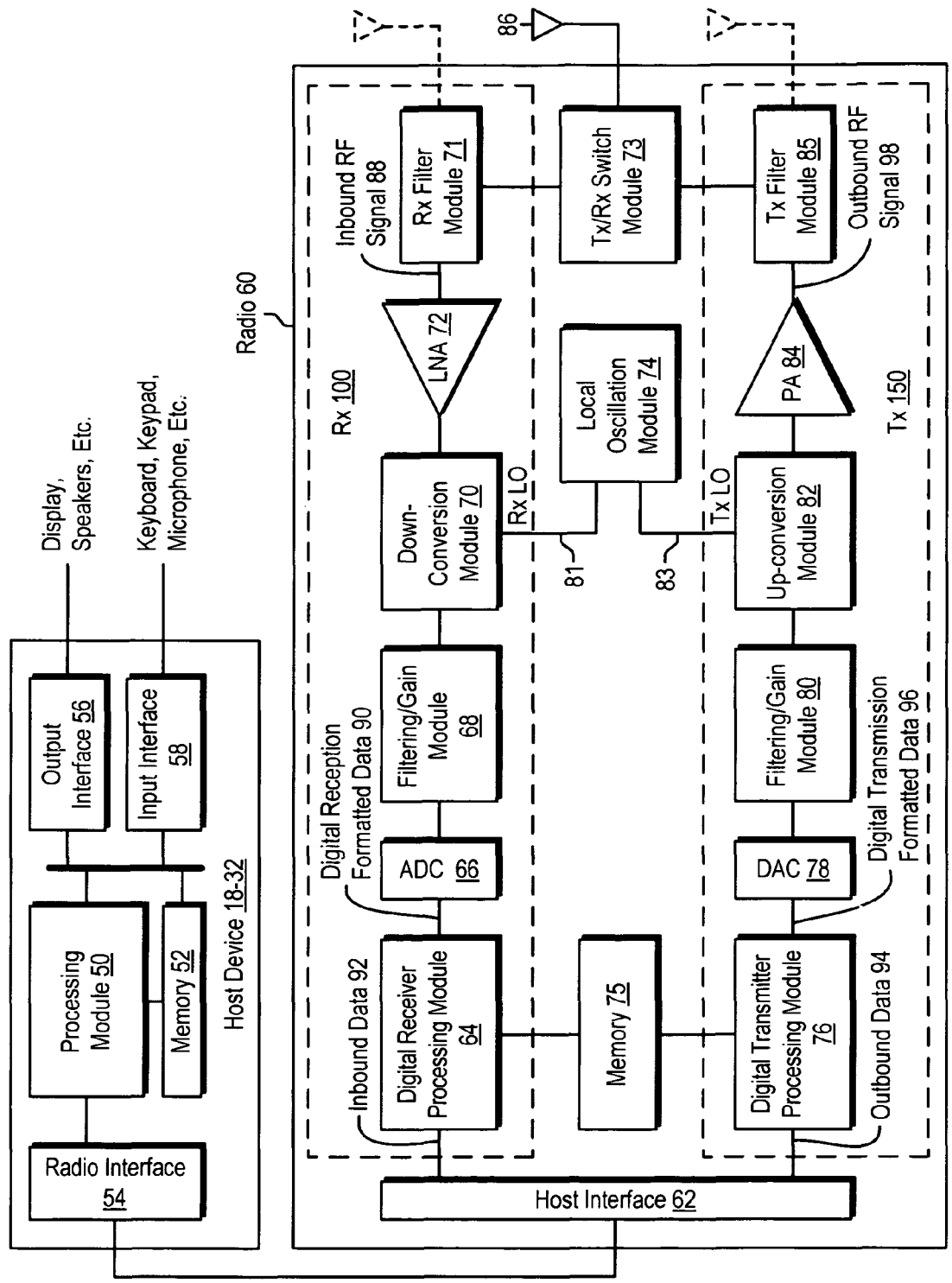
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device, such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a memory 75, a local oscillation module 74, a receiver 100, a transmitter 150, a transmitter/receiver (TX/RX) switch module 73 and an antenna 86. The receiver 100 includes a digital receiver processing module 64, an analog-to-digital converter 66, a filtering/gain module 68, a down-conversion module 70, a low noise amplifier 72 and a receiver filter module 71, while the transmitter 150 includes a digital transmitter processing module 76, a digital-to-analog converter 78, a filtering/gain module 80, an IF mixing up-conversion module 82, a power amplifier 84 and a transmitter filter module 85. The antenna 86 is shared by the transmitter 150 and receiver 100, as regulated by the TX/RX switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation.

The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., GSM, EDGE, WCDMA, Bluetooth EDR, etc.) to produce digital transmission formatted data 96. The digital transmission formatted data 96 is a digital baseband signal or a digital low IF signal, where the low IF typically will be in the frequency range of 100 KHz to a few Megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the TX/RX switch module 73, where the RX filter module 71 bandpass filters the inbound RF signal 88. The RX filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68. The filtering/gain module 68 filters and/or attenuates the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of host device 18-32 and the digital receiver processing module 64 and the digital transmitter processing module 76 of radio 60 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

Figure 3:
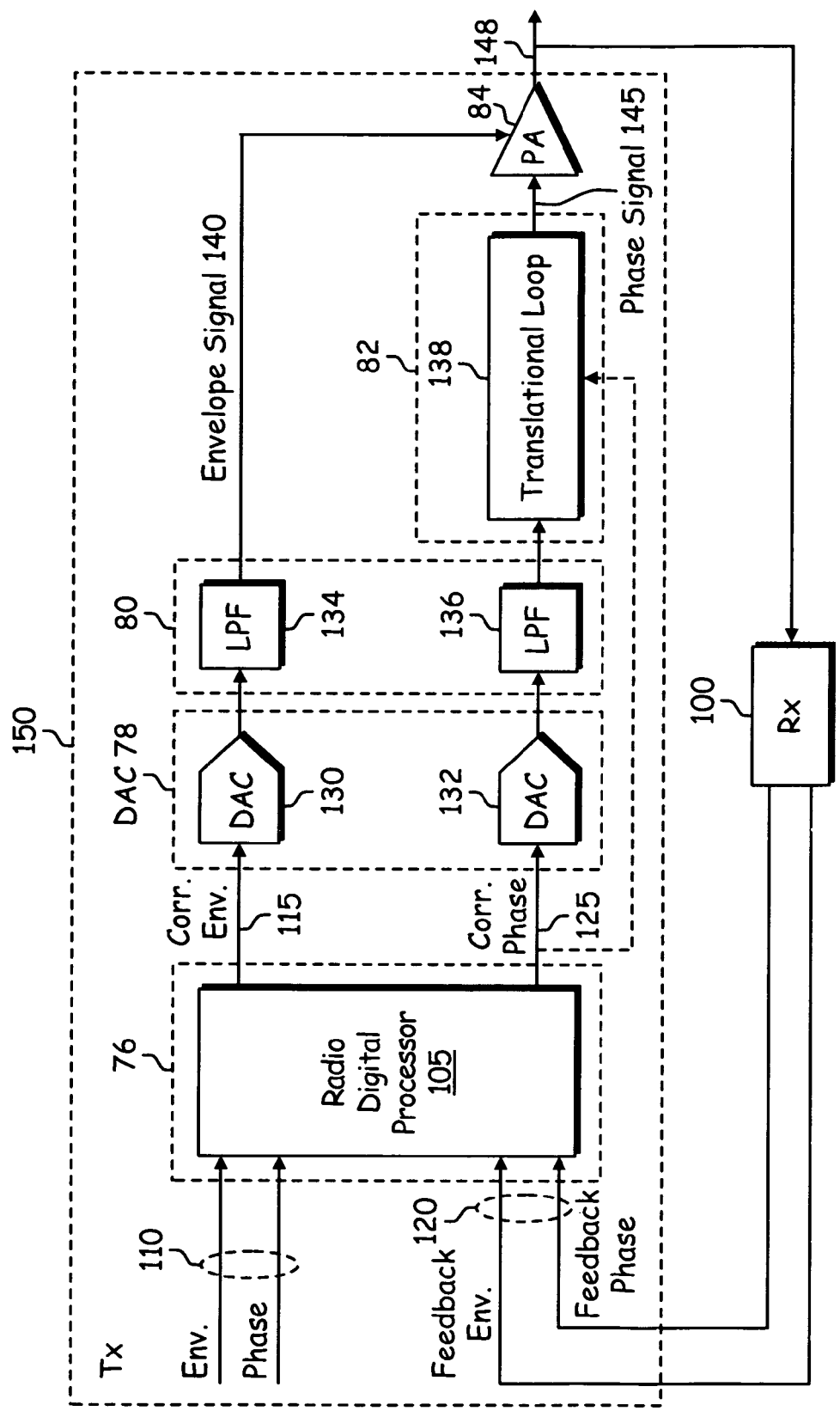
FIG. 3 is a schematic block diagram of an exemplary polar RF transmitter, in accordance with embodiments of the present invention.

FIG. 3 is a schematic block diagram of an exemplary polar RF transmitter architecture capable of compensating for non-linearities in the power amplifier 84 in accordance with embodiments of the present invention. The polar RF transmitter 150 shown FIG. 3 is functionally equivalent to blocks 76, 78, 80, 82 and 84 of FIG. 2. One typical application of the RF polar transmitter of FIG. 3 is EDGE, though the concepts may readily be applied to other types of communication networks. In FIG. 3, it is assumed that the necessary pulse shaping, modulation, and interpolation filtering has already been performed to produce a complex modulated digital signal 110 with an envelope (amplitude) component and a phase component.

The polar transmitter of FIG. 3 further includes a radio digital processor 105, high sample rate digital-to-analog converters (DACs) 130 and 132, low pass filters (LPFs) 134 and 136, a translational loop (e.g., a PLL) 138 and a power amplifier (PA) 84. In an exemplary embodiment, the functionality of the power amplifier 84 is provided by a combination of a low power on-chip power amplifier driver (PAD) and a high power off-chip power amplifier. The on-chip power amplifier performs the modulation of the RF signal, while the off-chip power amplifier amplifies the modulated RF signal to the appropriate output power level. However, due to imperfections in the PAD, nonlinearities, such as LO feed-through (LOFT), AM-AM distortion and AM-PM distortion, may arise, thereby affecting the performance of the transmitter by increasing both the spectral mask and the EVM of the transmitter.

Therefore, in accordance with embodiments of the present invention, a feedback loop is provided through the receiver 100 from the output of the PA 84 to the radio digital processor 105 to measure the nonlinearities in the PA 84 in a measurement mode and enable the radio digital processor to compensate for the measured nonlinearities in an operating mode. During the measurement mode of the polar transmitter 150, the radio digital processor 105 receives a feedback signal 120 from the feedback loop that contains an envelope (amplitude) component and a phase component for comparison with the amplitude and phase components of the input complex digital modulated signal 110. Based on the feedback signal 120, the radio digital processor 105 measures the LOFT, AM-AM and AM-PM distortion of the PA 84 and stores the measurements for subsequent use in the operating mode. In the operating mode, the radio digital processor 105 pre-distorts the envelope and phase components of the complex modulated digital signal 110 based on the stored measurements to effectively cancel the LOFT and AM/AM&PM distortions produced by the PA 84.

In an exemplary measurement mode operation of the polar transmitter 150, the envelope and phase components of the complex modulated digital signal 110 are input to the radio digital processor 105 for processing. During the measurement mode, the complex modulated digital signal 110 is a test signal designed to assist the radio digital processor 105 in measuring the nonlinearities of the PA 84. The radio digital processor 105 is further coupled to receive envelope and phase components of a feedback signal 120 from the output of the PA 84 via the receiver 100. The radio digital processor 105 operates to compare the complex modulated digital signal 110 to the feedback signal 120 to measure an error signal indicative of a difference between the complex modulated digital signal 110 and the feedback signal 120. For example, when measuring LOFT, the error signal can be a measure of the DC offset or bias that is added to the envelope path of the transmitter by the PA 84. As another example, when measuring AM/AM&PM distortion, the error signal can be a measure of the variation of the amplitude and phase of the output of the PA 84 as a function of the amplitude of the input complex modulated digital signal 110. The radio digital processor 105 stores the error signal measurements for subsequent use in an operating mode.

In an exemplary operating mode of the polar transmitter 150, the envelope and phase components of the complex modulated digital signal 110 are input to the radio digital processor 105 for processing. Based on the stored error measurements, the radio digital processor 105 is able to produce a correction signal that when added to the complex modulated digital signal 110 produces a corrected complex modulated digital signal including a corrected envelope signal 115 and a corrected phase signal 125 that digitally compensates for nonlinearities in the PA 84.

In either mode, the digital envelope signal 115 output from the radio digital processor 105 is input to high sample rate DAC 130, followed by LPF 134 to produce an analog envelope signal 140. In one embodiment, the digital phase signal 125 output from the radio digital processor 105 is input to high sample rate DAC 132, followed by LPF 136 to filter out any digital images to produce a phase-modulated analog signal that is provided to the input of the translational loop 138. The translational loop 138 operates to up-convert the phase-modulated analog signal from an intermediate frequency (IF) to a radio frequency (RF) to produce an RF phase signal (output carrier) 145. In another embodiment, as illustrated by the dotted line, and as further described below in connection with FIG. 4, the digital phase signal 125 output from the radio digital processor 105 is input directly to the translational loop 138. In this embodiment, the translational loop is a fractional-N phase-locked loop (PLL) that operates to produce the RF phase signal (output carrier) 145 such that the phase of the RF phase signal 145 phase tracks the phase of the digital phase signal 125. The RF output carrier 145 is modulated in the PA 84 by the analog envelope signal 140 to produce a modulated RF signal 148. In operating mode, the modulated RF signal 148 is transmitted over an antenna (not shown), while in measurement mode, the modulated RF signal 148 is fed back to the radio digital processor 105 through the receiver 100 as feedback signal 120.

Figure 4:
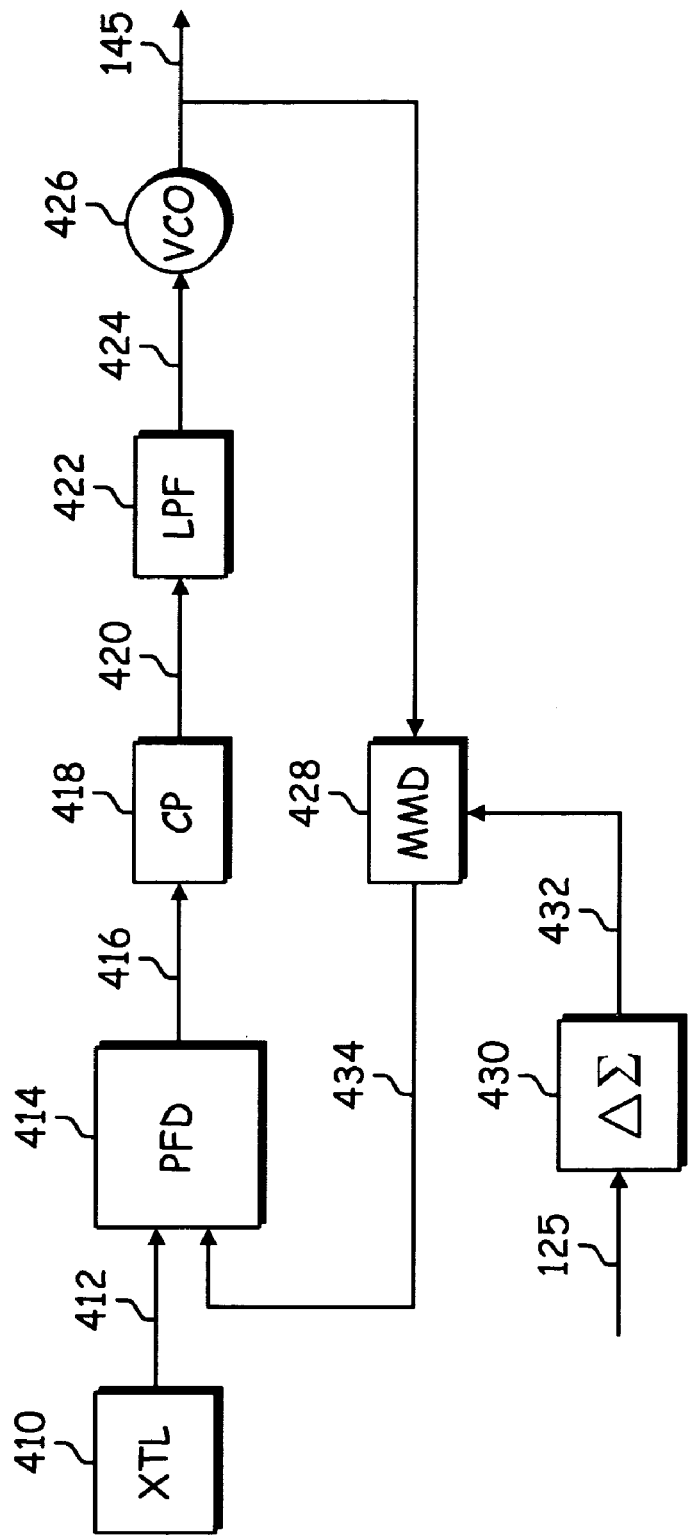
FIG. 4 is a schematic block diagram of an exemplary phase-locked loop (PLL) for use in a polar RF transmitter, in accordance with embodiments of the present invention.

FIG. 4 is a schematic block diagram of an exemplary phase-locked loop (PLL) for use in a polar RF transmitter. The PLL shown in FIG. 4 includes a phase frequency detector (PFD) 414, a charge pump (CP) 418, a low pass filter (LPF) 422, a voltage controlled oscillator (VCO) 426, a multi-modulus divider (MMD) 428 and a $\Delta\Sigma$ MMD controller 430. $\Delta\Sigma$ MMD controller 430 is coupled to receive the digital phase-modulated signal 125, and is operable to generate divider control signals 432 to the MMD 428 based upon the digital phase-modulated signal 125. The MMD 428 is coupled to receive the divider control signals 432 from the $\Delta\Sigma$ MMD controller 430 and is operable to produce a feedback signal 434 based on the divider control signals 432.

The PFD 414 is coupled to receive a precise reference signal 412 from a crystal oscillator 410 for comparing with the feedback signal 434 to produce an error signal 416 indicative of a phase or frequency difference between the reference signal 412 and the feedback signal 434. The CP 418 produces current pulses 420 based upon the error signal 416, and provides the current pulses to LPF 422. LPF 422 filters the current pulses 420 to produce a control voltage 424 that controls the oscillation of the VCO 426. In response to the control voltage 424, VCO 426 produces an oscillation that is output as the RF phase signal 145. In addition, the oscillation 145 produced by the VCO 426 is fed back to the MMD 428, which divides the oscillation 145 by a divider ratio to produce the feedback signal 434 that is provided to the PFD 414. As described above, MMD 428 sets the divider ratio based upon the divider control signal 432 received from the $\Delta\Sigma$ MMD controller 430, and $\Delta\Sigma$ MMD controller 430 generates the divider control signal 432 based upon the digital phase-modulated signal 125.

In a practical setting, the VCO 426 typically undergoes "calibration" as part of operating the PLL. This calibration sets the approximate operating point of the VCO and allows the VCO to function over a wide range of frequencies. The VCO is typically calibrated for every channel hop. This calibration process involves a sequence of switching in and out of capacitors that tune the operation frequency of the VCO. Typically, calibration of a PLL occurs in two stages. Initially, an open loop stage serves to place the output oscillation with an approximate deviation of a desired frequency of oscillation. The open loop stage is then followed by a closed loop stage that locks the oscillation to a desired frequency of oscillation.

In a properly designed PLL, the feedback loop properties of the PLL results in the VCO output 145 "locking" to a frequency equal to the product of crystal oscillator reference frequency 412 and the divider ratio of the MMD 428. Thus, the closed loop tracking action causes the error signal 416 to approach zero, and therefore, the phase of the RF output carrier 145 tracks the phase of the digital phase-modulated signal 125, as desired.

Figure 5:
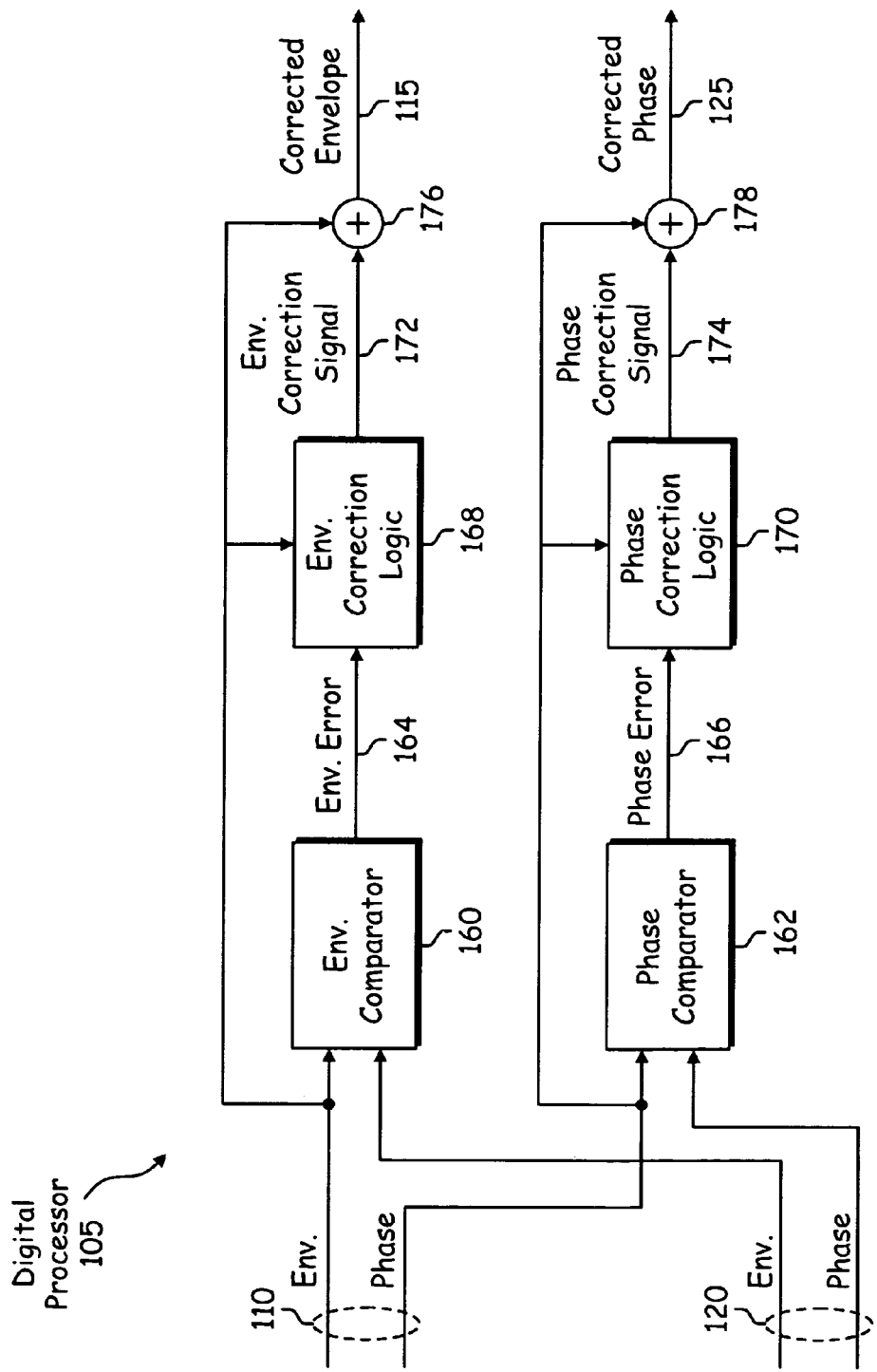
FIG. 5 is a schematic block diagram of an exemplary digital processor for use in a polar RF transmitter, in accordance with embodiments of the present invention.

FIG. 5 is a schematic block diagram of an exemplary digital processor 105 for use in a polar RF transmitter, in accordance with embodiments of the present invention. The digital processor 105 includes an envelope comparator 160 for comparing the envelope components of the complex modulated digital signal 110 and the feedback signal 120 and a phase comparator 162 for comparing the phase components of the complex modulated digital signal 110 and feedback signal 120 during measurement mode. The output of the envelope comparator 160 is an envelope error signal 164 indicative of a difference in amplitude between the envelope components of the complex modulated digital signal 110 and feedback signal 120. The output of the phase comparator 162 is a phase error signal 166 indicative of a difference in phase between the phase components of the complex modulated digital signal 110 and feedback signal 120.

The envelope error signal 164 is stored in envelope correction logic 168 and the phase error signal 166 is stored in phase correction logic 170 for subsequent use during operating mode. Thus, during operating mode, the envelope component of the complex modulated digital signal 110 is input to the envelope correction logic 168 and the phase component of the complex modulated digital signal 110 is input to the phase correction logic 170. The envelope correction logic 168 operates to produce an envelope correction signal 172 based on the stored envelope error signal 164 and the envelope component of the complex modulated digital signal 110, and the phase correction logic 170 operates to produce a phase correction signal 174 based on the stored phase error signal 166 and the phase component of the complex modulated digital signal 110. The envelope correction signal 172 is added to the envelope component of the complex modulated digital signal 110 by adder 176 to produce the corrected envelope signal 115. The phase correction signal 174 is added to the phase component of the complex modulated digital signal 110 by adder 178 to produce the corrected phase signal 125. Thus, the output of the digital processor 105 is a pre-distorted signal (corrected envelope 115 and corrected phase 125) that compensates for nonlinearities in the power amplifier.

Figure 6:
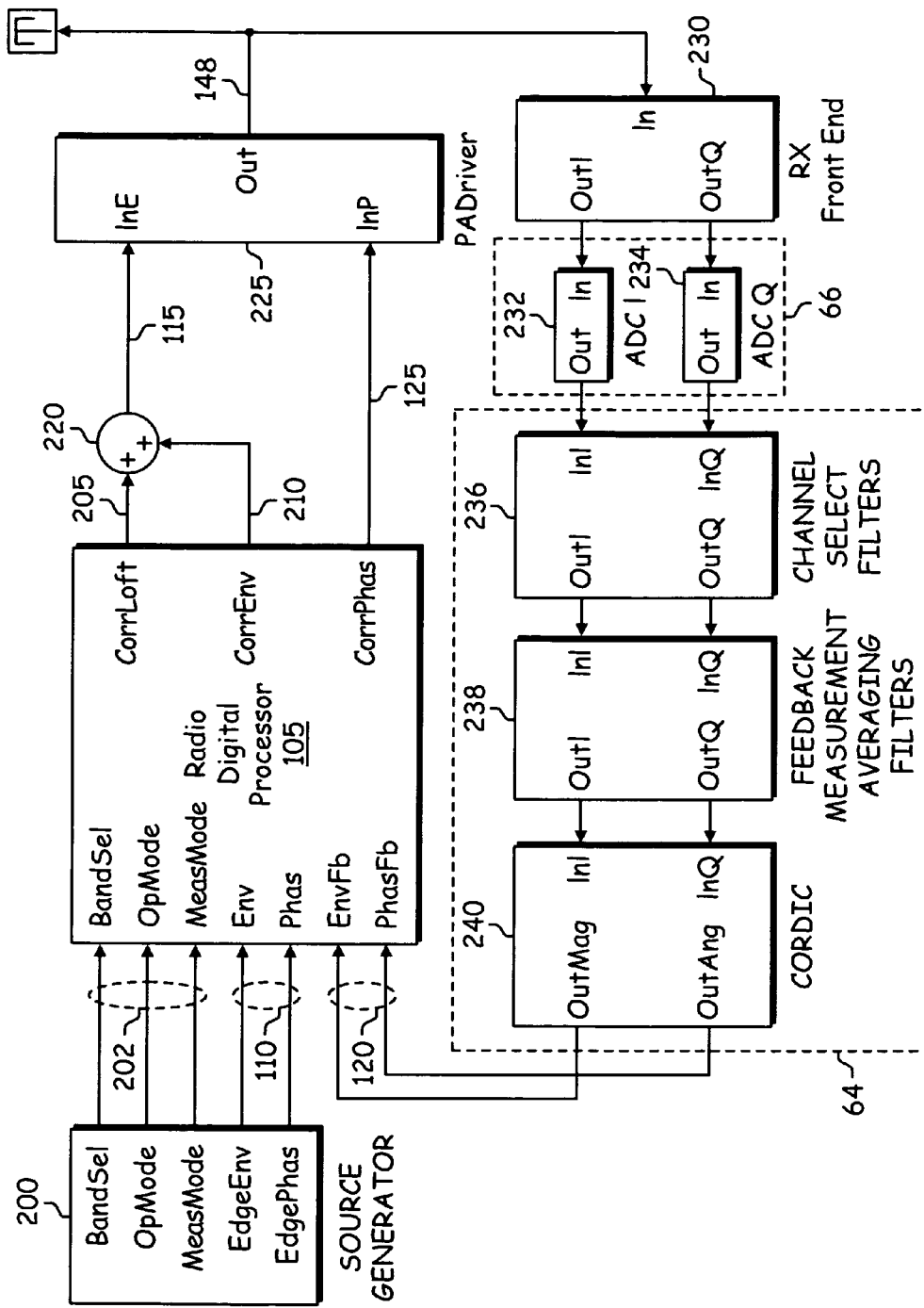
FIG. 6 is a schematic block diagram of an exemplary RF transceiver providing digital compensation for nonlinearities in the power amplifier of the transmitter, in accordance with embodiments of the present invention.

FIG. 6 is a schematic block diagram of an exemplary RF transceiver providing digital compensation for nonlinearities in the power amplifier of the polar transmitter, in accordance with embodiments of the present invention. The transceiver shown in FIG. 6 includes the radio digital processor 105, a source generator 200, a power amplifier driver (PAD) 225 and a feedback path including various receiver circuitry 230, 66 and 64. The source generator 200 is operable to generate a control signal 202 that controls the radio digital processor 105. For example, to begin the measurement process, the source generator 200 enables a measurement mode in the radio digital processor 105. Similarly, to begin normal operation of the radio digital processor, the source generator enables an operating mode in the radio digital processor 105. In addition, while in measurement mode, the source generator 200 is operable to generate a complex digital test signal 110 including envelope and phase components and to provide the complex digital test signal 110 to the radio digital processor 105.

The receiver circuitry includes RX front end circuitry 230 (e.g., a low noise amplifier, down-conversion module and various filtering/gain modules), a complex analog-to-digital converter 66, channel select filters 236, feedback measurement averaging filter 238 and a coordinate rotation digital computer (CORDIC) module 240. The complex analog-to-digital converter (ADC) 300 is connected to receive an analog complex signal from the RX front end circuitry 230. The analog complex signal includes analog in-phase and quadrature phase signals. The analog in-phase signal is received at a first ADC 232 of the complex ADC 66 and the quadrature phase signal is received at a second ADC 234 of the complex ADC 66. The first ADC 232 converts the analog in-phase signal from the analog domain to the digital domain to produce a digital in-phase signal. The second ADC 234 converts the analog quadrature phase signal from the analog domain to the digital domain to produce a digital quadrature phase signal.

The digital in-phase and quadrature-phase signals are input to the channel select filters 236 and feedback measurement averaging filters 236 to filter the digital in-phase and quadrature-phase signals to produce digital filtered in-phase and quadrature-phase signals. In one embodiment, the feedback measurement averaging filters 238 are low pass filters. The in-phase and quadrature-phase digital filtered signals are input to the CORDIC module 240, which serves as a vector de-rotator to de-rotate the I and Q vector digital data. For example, in one embodiment, the CORDIC module 240 can de-rotate the complex input vector back down to the real axis to produce a digitized feedback signal 120 representing the angle (phase) and magnitude (envelope) of the complex input vector.

In an exemplary operation of the RF transceiver of FIG. 6, the source generator 200 first enables the measurement mode in the radio digital processor 105 and selects the appropriate bandwidth using the control signal 202. While in measurement mode, the radio digital processor 105 is connected to receive the feedback signal 120 via the feedback loop and a complex digital test signal 110 from the source generator 200. In an exemplary embodiment, the complex digital test signal 110 includes a sequence of test signals designed to measure the nonlinearities in the PAD 225. The complex digital test signal 110 is output to the PAD 225 from the radio digital processor to produce a test RF signal 148, which is fed back to the radio digital processor 105 via the RX front end 230, complex DAC's 232 and 234, channel select filters 236, feedback measurement averaging filters 238 and CORDIC module 240.

The radio digital processor 105 compares the envelope and phase components of the complex digital test signal 110 to the envelope and phase components of the feedback signal 120 to measure an error signal indicative of a difference therebetween. For example, the radio digital processor 105 can first measure the LOFT by maintaining a constant envelope test signal 110 and measuring the DC offset between the test signal 110 and the feedback signal 120. Once the LOFT has been measured, the radio digital processor 105 can then measure the AM/AM& PM distortion by allowing the complex digital test signal 110 to sweep the dynamic range of the polar transmitter and measuring the envelope and phase distortion profiles that indicate the variation of the amplitude and phase of the output of the PAD 225 as a function of the amplitude of the input complex digital test signal 110.

Figure 7:
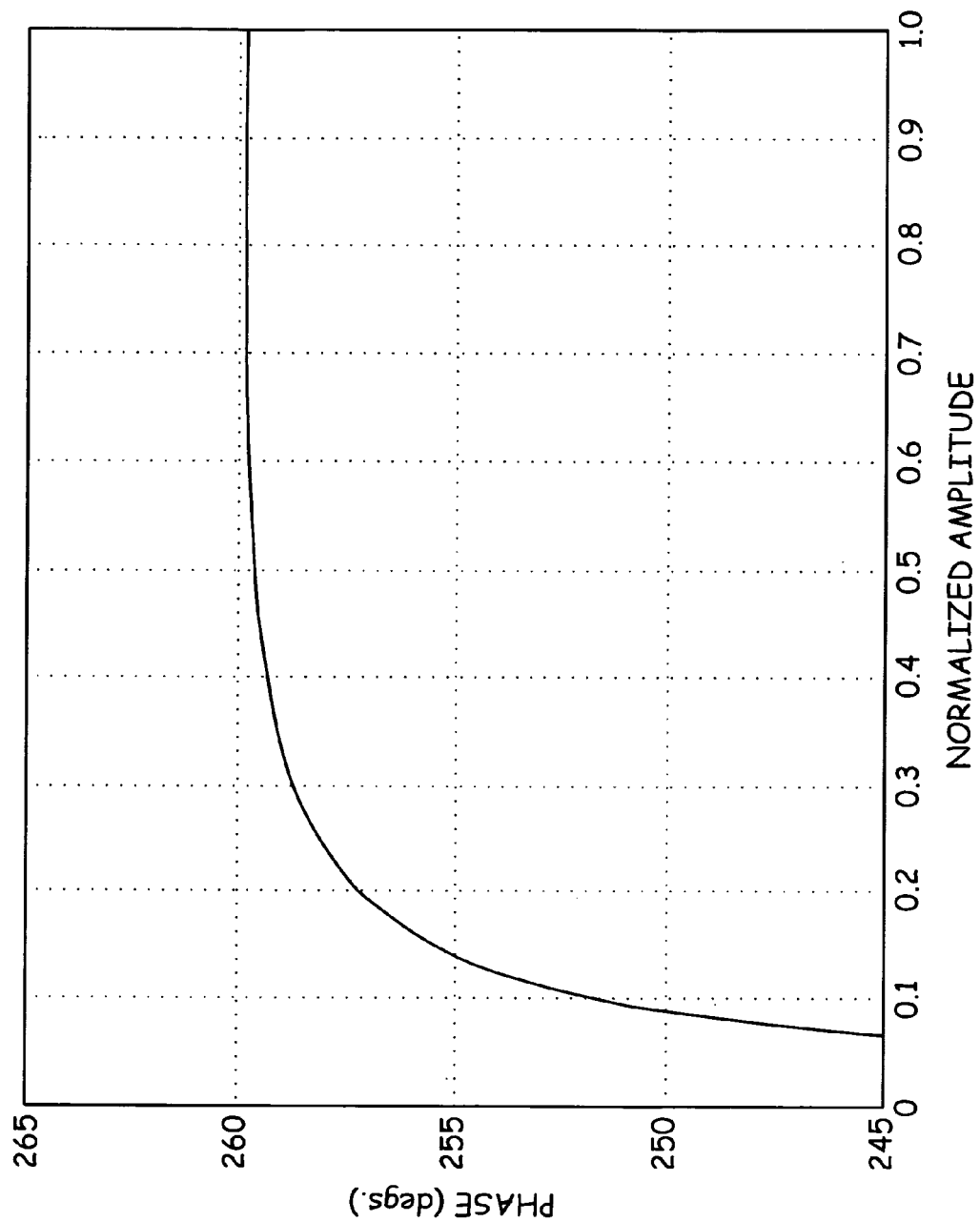
FIG. 7 is a graph illustrating exemplary phase distortion produced by a power amplifier in a polar transmitter.
Figure 8:
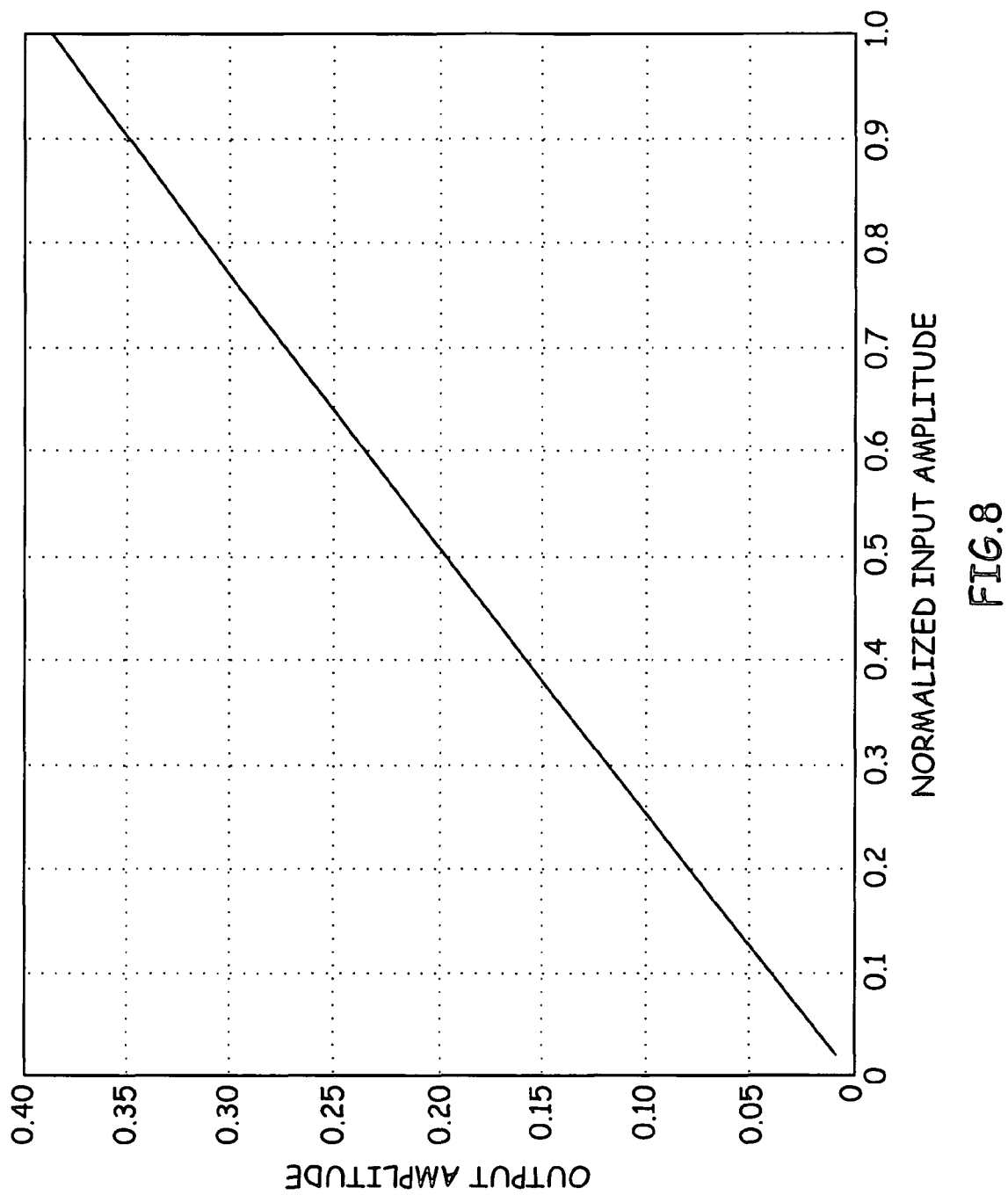
FIG. 8 is a graph illustrating exemplary amplitude distortion produced by a power amplifier in a polar transmitter.

For example, an exemplary profile of the phase distortion produced by the PAD as a function of the amplitude of the input test signal is shown in FIG. 7. Ideally, the phase response of the PAD to changes in the amplitude of the input test signal should be linear. However, as can be seen in FIG. 7, the phase response of the PAD varies significantly with amplitude. In addition, an exemplary profile of the amplitude distortion produced by the PAD as a function of the amplitude of the input test signal is shown in FIG. 8. Although the profile shown in FIG. 8 appears to be linear, there are actually small amounts of non-visible nonlinearity present in the profile. Thus, the gradient of the curve shown in FIG. 8 varies slightly.

Referring again to FIG. 6, after the nonlinearities in the PAD 225 have been measured and stored, the source generator 200 enables the operating mode of the radio digital processor 105. While in operating mode, the radio digital processor 105 is connected to receive a complex modulated digital signal 110 generated by a baseband processor either directly from the baseband processor or via the source generator 200. The envelope and phase components of the complex modulated digital signal 110 are input to the radio digital processor 105 for pre-distorting to compensate for nonlinearities in the PAD 225. Based on the stored error measurements, the radio digital processor 105 is able to produce a correction signal that when added to the complex modulated digital signal 110 produces a corrected complex modulated digital signal including a corrected envelope signal 115 and a corrected phase signal 125 that digitally compensates for the nonlinearities in the PAD 225.

For example, in one embodiment, the radio digital processor 105 can add a DC offset with the opposite sign of the measured LOFT to the envelope component of the complex modulated digital signal to produce a LOFT corrected signal 205. In addition, the radio digital processor 105 can apply an inverse envelope distortion profile to the envelope component of the complex modulated digital signal to produce an envelope distortion corrected signal 210 and can apply an inverse phase distortion profile to the phase component of the complex modulated digital signal to produce a corrected phase signal 125. The LOFT corrected signal 205 can be added to the envelope distortion corrected signal 210 at an adder 220 to produce the corrected envelope signal 115.

Figure 9:
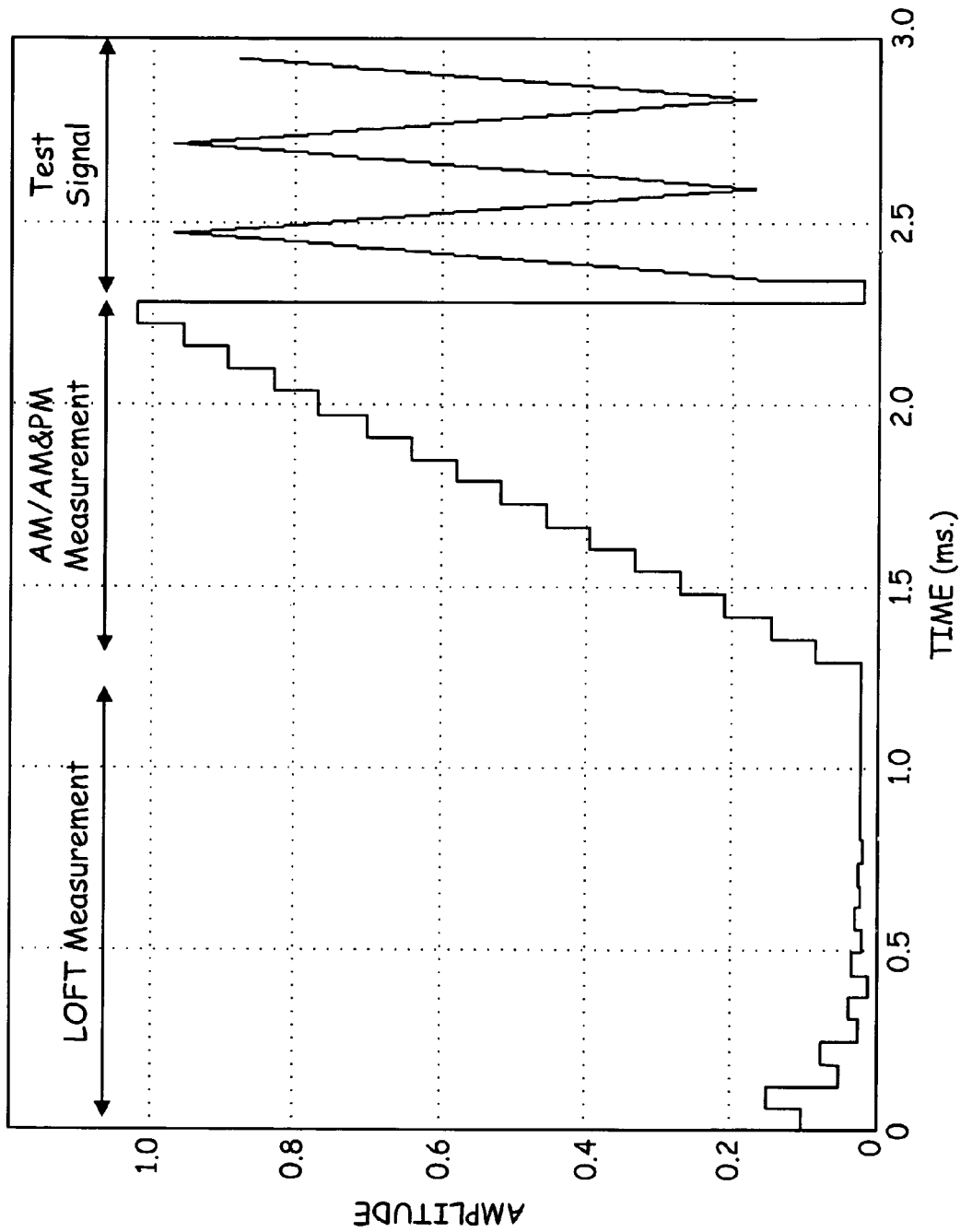
FIG. 9-11 illustrate exemplary waveforms produced during the measurement and compensation of power amplifier nonlinearities.
Figure 10:
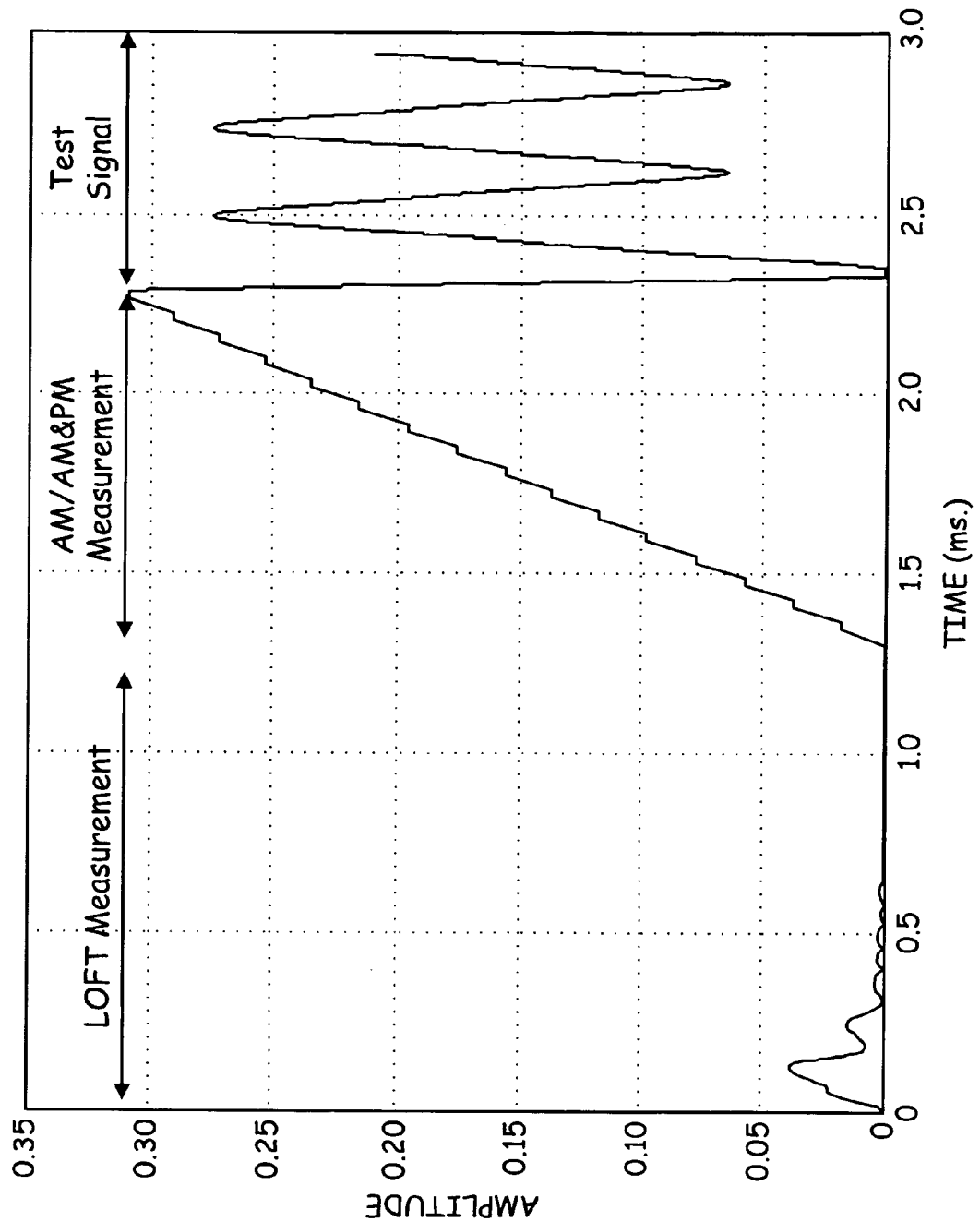
Figure 11:
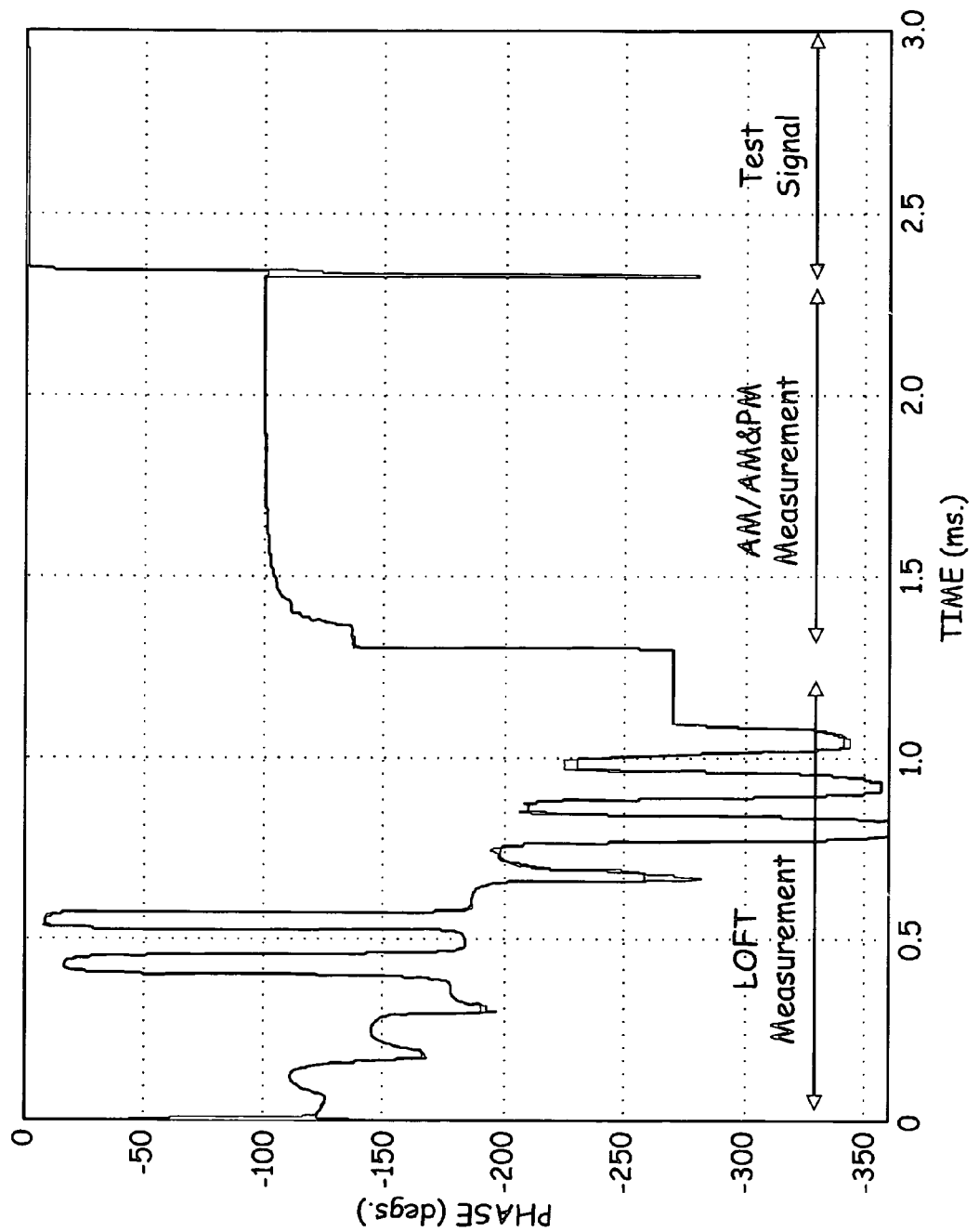

FIGS. 9-11 illustrate exemplary waveforms produced during the measurement and compensation of power amplifier nonlinearities. FIG. 9 is an exemplary waveform illustrating the amplitude of the output of the PAD (e.g., RF signal 148, shown in FIG. 6) during an exemplary measurement mode and an exemplary operating mode of the transmitter. Initially, in measurement mode, the LOFT of the PAD is measured by maintaining a constant envelope test signal at the input of the radio digital processor. As can be seen in FIG. 9, during the measurement of the LOFT, the radio digital processor 105 applies a binary search algorithm that successively adjusts the bias of the envelope signal to converge to a minimum value of DC offset in the output.

Then, during the AM/AM&PM measurement period, the radio digital processor maintains the DC bias of the envelope signal while sweeping the amplitude through the dynamic range of the transmitter. As can be seen in FIG. 9, the output signal during the AM/AM&PM measurement period is a stair case curve including sixteen measurement points on the amplitude axis. Thus, at each amplitude measurement point (i.e., each step), the radio digital processor compares the feedback signal to the test signal to measure the AM and PM distortion in the feedback signal. From the measurements taken at each measurement point, the radio digital processor is able to construct the envelope and phase distortion profiles, such as the profiles shown in FIGS. 7 and 8.

For example, to construct the phase distortion profile shown in FIG. 7, the radio digital processor can employ a quadratic polynomial curve-fit using the PM distortion measurements taken at each measurement point. As another example, to construct the envelope distortion profile shown in FIG. 8, the radio digital processor can employ a linear polynomial curve-fit using the AM distortion measurements taken at each measurement point.

After the AM/AM&PM measurement period, a sawtooth test signal that sweeps the amplitude range of the transmitter with constant phase is applied to the radio digital processor in an operating mode to compensate for the nonlinearities measured in the LOFT and AM/AM&PM measurement periods.

As can be seen in FIG. 9, there is minimal distortion in the amplitude of the output test signal after amplitude compensation.

FIG. 10 is an exemplary waveform of the envelope component of the feedback signal 120 (i.e., OutMag), shown in FIG. 6. As can be seen in FIG. 10, during the measurement of the LOFT, the DC offset in the feedback signal varies while the radio digital processor is applying the binary search algorithm until the DC offset in the feedback signal reaches zero. Then, during the AM/AM&PM measurement period, as can be seen in FIG. 10, the feedback signal contains some AM distortion at each measurement point, which is used to create the AM distortion profile shown in FIG. 8. Finally, during the test signal period, the feedback signal also demonstrates minimal amplitude distortion after amplitude compensation.

FIG. 11 is an exemplary waveform of the phase component of the feedback signal 120 (i.e., OutAng), shown in FIG. 6. As can be seen in FIG. 11, phase distortion is present during the AM/AM&PM measurement period, and the measured distortion can be used to create the PM distortion profile shown in FIG. 7. In addition, as can be seen during the test signal period, there is minimal phase distortion present in the feedback signal after phase compensation.

Figure 12:
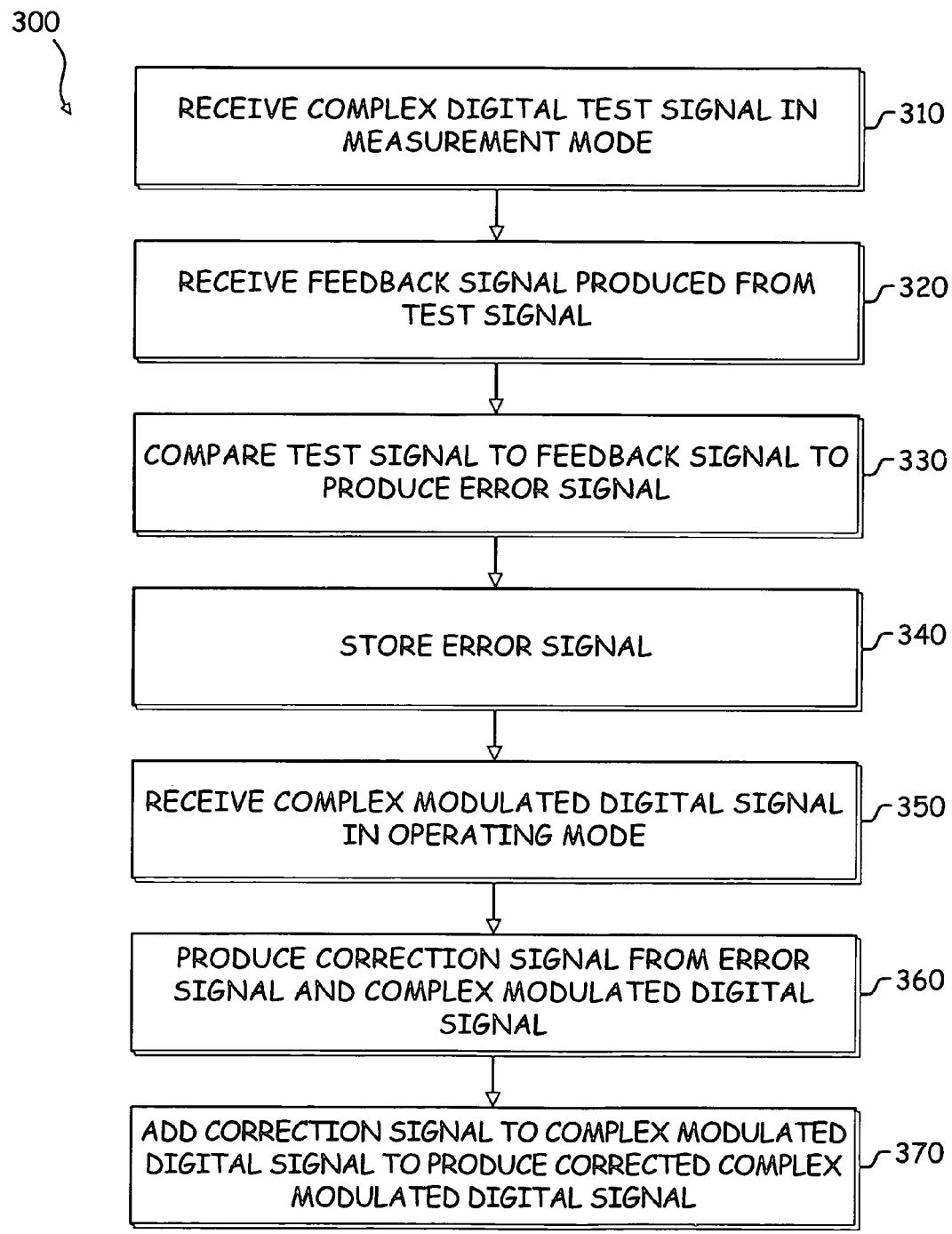
FIG. 12 is a flow chart illustrating a method in accordance with embodiments of the present invention.

FIG. 12 is a flow chart illustrating a method 300 for compensating for nonlinearities of a polar transmitter, in accordance with embodiments of the present invention. Initially, at steps 310 and 320, during a measurement mode, a complex digital test signal and a feedback signal produced from the complex digital test signal are received. At step 330, the complex digital test signal is compared to the feedback signal to measure an error signal indicative of a difference between the complex digital test signal and the feedback signal. For example, when measuring local oscillator feed-through (LOFT) of the power amplifier (PA), the error signal can be a measure of the DC offset or bias that is added to the envelope path of the transmitter by the PA. As another example, when measuring AM/AM&PM distortion in the PA, the error signal can be a measure of the variation of the amplitude and phase of the output of the PA as a function of the amplitude of the complex digital test signal. At step 340, the error signal measurements are stored for subsequent use in an operating mode of the polar transmitter.

During the operating mode, at step 350, a complex modulated digital signal is received, and at step 360, a correction signal is produced based on the error signal and the complex modulated digital signal. Finally, at step 370, the correction signal is added to the complex modulated digital signal to produce a corrected complex modulated digital signal that compensates for nonlinearities (e.g., LOFT, AM/AM&PM distortion) in the PA of the polar transmitter.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A radio frequency (RF) polar transmitter, comprising:
a digital processor coupled to receive a complex modulated digital signal and a feedback signal and operable to compare the complex modulated digital signal to the feedback signal to determine an error signal indicative of a difference between the complex modulated digital signal and the feedback signal and further operable to produce a correction signal from the error signal and to add the correction signal to the complex modulated digital signal to produce a corrected complex modulated digital signal, the corrected complex modulated digital signal including an amplitude-modulated digital signal and a phase-modulated digital signal;
a Digital-to-Analog Converter (DAC) for converting the amplitude-modulated digital signal from analog to digital to produce an amplitude-modulated analog signal;
a translational loop operable to produce a phase-modulated RF signal from the phase-modulated digital signal;
a power amplifier operable to produce a modulated RF signal from the phase-modulated RF signal and the amplitude-modulated analog signal; and
a feedback loop coupled to receive the modulated RF signal from the power amplifier and operable to produce the feedback signal from the modulated RF signal.

2. The polar transmitter of claim 1, wherein the Digital-to-Analog converter includes first and second Digital-to-Analog converters for converting the amplitude-modulated digital signal and the phase-modulated digital signal, respectively, from analog to digital to produce a phase-modulated analog signal and the amplitude-modulated analog signal, respectively, and
wherein the translational loop is coupled to receive the phase-modulated analog signal and operable to up-convert the phase-modulated analog signal from an intermediate frequency to a radio frequency to produce the phase-modulated RF signal.

3. The polar transmitter of claim 1, wherein the translational loop is a phase-locked loop coupled to receive the phase-modulated digital signal and operable to produce the phase-modulated RF signal that tracks the phase of the phase-modulated digital signal.

4. The polar transmitter of claim 1, wherein:
the feedback signal includes a phase-modulated feedback signal and an amplitude-modulated feedback signal;
the digital processor is operable to compare the phase-modulated feedback signal to the phase-modulated digital signal to produce a phase error signal indicative of a difference between the phase-modulated digital signal and the phase-modulated feedback signal and to compare the amplitude-modulated feedback signal to the amplitude-modulated digital signal to produce an amplitude error signal indicative of a difference between the amplitude-modulated digital signal and the amplitude-modulated feedback signal;
the digital processor is operable to produce a phase correction signal from the phase error signal and an amplitude correction signal from the amplitude error signal; and
the digital processor is operable to add the phase correction signal to the phase-modulated digital signal to produce a corrected phase-modulated digital signal and to add the amplitude correction signal to the amplitude-modulated digital signal to produce a corrected amplitude-modulated digital signal.

5. The polar transmitter of claim 4, wherein the modulated RF signal includes an amplitude modulated distortion signal produced by the power amplifier; and wherein the digital processor is operable to measure the amplitude modulated distortion signal as the amplitude error signal and to compensate for the amplitude modulated distortion signal using a quadratic polynomial curve-fit to produce the amplitude correction signal.

6. The polar transmitter of claim 5, wherein the modulated RF signal includes a phase modulated distortion signal produced by the power amplifier; and wherein the digital processor is operable to measure the phase modulated distortion signal as the phase error signal and to compensate for the phase modulated distortion signal using a linear polynomial curve-fit to produce the phase correction signal.

7. The polar transmitter of claim 5, wherein the modulated RF signal includes a local oscillator feed through signal produced by the power amplifier, and wherein the digital processor is operable to measure the local oscillator feed through signal and to compensate for the local oscillator feed through signal by biasing the corrected amplitude signal with a DC value determined from the local oscillator feed through signal.

8. The polar transmitter of claim 7, wherein the complex modulated digital signal includes a sequence of test signals in a measurement mode, and further comprising:
a source generator for generating the sequence of test signals in the measurement mode and for generating a control signal that drives the digital processor during the measurement mode.

9. A radio frequency (RF) transceiver, comprising:
a polar transmitter including:
a digital processor coupled to receive a complex modulated digital signal and a feedback signal and operable to compare the complex modulated digital signal to the feedback signal to determine an error signal indicative of a difference between the complex modulated digital signal and the feedback signal and further operable to produce a correction signal from the error signal and to add the correction signal to the complex modulated digital signal to produce a corrected complex modulated digital signal, the corrected complex modulated digital signal including an amplitude-modulated digital signal and a phase-modulated digital signal;
a Digital-to-Analog Converter (DAC) for converting the amplitude-modulated digital signal from analog to digital to produce an amplitude-modulated analog signal;
a translational loop operable to produce a phase-modulated RF signal from the phase-modulated digital signal; and
a power amplifier operable to produce a modulated RF signal from the phase-modulated RF signal and the amplitude-modulated analog signal; and a receiver coupled in a feedback loop with the transmitter to receive the modulated RF signal from the power amplifier and operable to produce the feedback signal from the modulated RF signal.

10. The RF transceiver of claim 9, wherein the Digital-to-Analog converter includes first and second Digital-to-Analog converters for converting the amplitude-modulated digital signal and the phase-modulated digital signal, respectively, from analog to digital to produce a phase-modulated analog signal and the amplitude-modulated analog signal, respectively, and
wherein the translational loop is coupled to receive the phase-modulated analog signal and operable to up-convert the phase-modulated analog signal from an intermediate frequency to a radio frequency to produce the phase-modulated RF signal.

11. The RF transceiver of claim 9, wherein the translational loop is a phase-locked loop coupled to receive the phase-modulated digital signal and operable to produce the phase-modulated RF signal that tracks the phase of the phase-modulated digital signal.

12. The RF transceiver of claim 9, wherein:
the feedback signal includes a phase-modulated feedback signal and an amplitude-modulated feedback signal;
the digital processor is operable to compare the phase-modulated feedback signal to the phase-modulated digital signal to produce a phase error signal indicative of a difference between the phase-modulated digital signal and the phase-modulated feedback signal and to compare the amplitude-modulated feedback signal to the amplitude-modulated digital signal to produce an amplitude error signal indicative of a difference between the amplitude-modulated digital signal and the amplitude-modulated feedback signal;
the digital processor is operable to produce a phase correction signal from the phase error signal and an amplitude correction signal from the amplitude error signal; and
the digital processor is operable to add the phase correction signal to the phase-modulated digital signal to produce a corrected phase-modulated digital signal and to add the amplitude correction signal to the amplitude-modulated digital signal to produce a corrected amplitude-modulated digital signal.

13. The RF transceiver of claim 12, wherein:
the modulated RF signal includes an amplitude modulated distortion signal produced by the power amplifier;
the digital processor is operable to measure the amplitude modulated distortion signal as the amplitude error signal and to compensate for the amplitude modulated distortion signal using a quadratic polynomial curve-fit to produce the amplitude correction signal;
the modulated RF signal includes a phase modulated distortion signal produced by the power amplifier; and
the digital processor is operable to measure the phase modulated distortion signal as the phase error signal and to compensate for the phase modulated distortion signal using a linear polynomial curve-fit to produce the phase correction signal.

14. The RF transceiver of claim 13, wherein the modulated RF signal includes a local oscillator feed through signal produced by the power amplifier, and wherein the digital processor is operable to measure the local oscillator feed through signal and to compensate for the local oscillator feed through signal by biasing the corrected amplitude signal with a DC value determined from the local oscillator feed through signal.

15. The RF transceiver of claim 14, wherein the complex modulated digital signal includes a sequence of test signals in a measurement mode, and further comprising:
a source generator for generating the sequence of test signals in the measurement mode and for generating a control signal that drives the digital processor during the measurement mode.

16. The RF transceiver of claim 9, wherein the receiver further includes:
radio circuitry coupled to receive the modulated RF signal from the power amplifier and operable to down-convert the modulated RF signal to an IF analog signal;
an analog-to-digital converter for converting the IF analog signal into an IF digital signal;
a filter operable to filter the IF digital signal to produce a filtered IF digital signal; and
a vector de-rotator coupled to receive the filtered IF digital signal and operable to vector de-rotate the filtered IF digital signal to produce the feedback signal.

17. A method for compensating for nonlinearities of a polar transmitter, comprising the steps of:
receiving a complex digital test signal in a measurement mode;
converting the complex digital test signal to a complex analog test signal;
amplifying the complex analog test signal to produce a test RF signal;
coupling the test RF signal through a feedback loop to produce a feedback signal;
comparing the complex digital test signal to the feedback signal to determine an error signal indicative of a difference between the complex digital test signal and the feedback signal;
storing the error signal;
receiving a complex modulated digital signal in an operating mode;
producing a correction signal based on the error signal and the complex modulated digital signal; and
adding the correction signal to the complex modulated digital signal to produce a corrected complex modulated digital signal.

18. The method of claim 17, wherein said step of coupling further includes:
coupling the test RF signal to a receiver of a transceiver including the polar transmitter to produce the feedback signal; and
coupling the feedback signal to the polar transmitter.

19. The method of claim 17, further comprising the steps of:
converting the corrected complex modulated digital signal to a complex modulated analog signal; and
amplifying the complex modulated analog signal to produce a modulated RF signal.

20. The method of claim 19, wherein the complex digital test signal and the complex modulated digital signal each include a respective amplitude-modulated digital signal and a respective phase-modulated digital signal, and wherein:
the feedback signal includes a phase-modulated feedback signal and an amplitude-modulated feedback signal;
said step of comparing further includes:
comparing the phase-modulated feedback signal to the phase-modulated digital signal of the complex digital test signal to produce a phase error signal indicative of a difference between the phase-modulated digital signal and the phase-modulated feedback signal; and
comparing the amplitude-modulated feedback signal to the amplitude-modulated digital signal of the complex digital test signal to produce an amplitude error signal indicative of a difference between the amplitude-modulated digital signal and the amplitude-modulated feedback signal;

said step of producing the correction signal further includes:

producing a phase correction signal based on the phase error signal and the phase-modulated digital signal of the complex modulated digital signal and an amplitude correction signal based on the amplitude error signal and the amplitude-modulated digital signal of the complex modulated digital signal; and said step of adding further includes:

adding the phase correction signal to the phase-modulated digital signal of the complex modulated digital signal to produce a corrected phase-modulated digital signal; and adding the amplitude correction signal to the amplitude-modulated digital signal of the complex modulated digital signal to produce a corrected amplitude-modulated digital signal.

21. The method of claim 20, wherein the test RF signal includes an amplitude modulated distortion signal produced by said step of amplifying the complex analog test signal; and wherein said step of producing the correction signal further includes:

compensating for the amplitude modulated distortion signal using a quadratic polynomial curve-fit of the amplitude error signal to produce the amplitude correction signal.

22. The method of claim 21, wherein the test RF signal includes a phase modulated distortion signal produced by said step of amplifying the complex analog test signal; and wherein said step of producing the correction signal further includes:

compensating for the phase modulated distortion signal using a linear polynomial curve-fit of the phase error signal to produce the phase correction signal.

23. The method of claim 17, wherein the test RF signal includes a local oscillator feed through signal produced by said step of amplifying the complex analog test signal, and wherein said step of producing the correction signal further includes:

compensating for the local oscillator feed through signal by biasing the corrected amplitude signal with a DC value determined from the error signal.

24. The method of claim 17, wherein the complex digital test signal includes a sequence of test signals, and further comprising the steps of:

generating a control signal to initiate a measurement mode; and generating the sequence of test signals in the measurement mode.

* * * * *